United States Patent
Harris

[11] Patent Number: 5,652,437
[45] Date of Patent: Jul. 29, 1997

[54] SEMICONDUCTOR DEVICE WITH A LOW RESISTANCE OHMIC CONTACT BETWEEN A METAL LAYER AND A SIC-LAYER

[75] Inventor: Christopher Harris, Sollentuna, Sweden

[73] Assignee: ABB Research Ltd., Zurich, Switzerland

[21] Appl. No.: 602,045

[22] Filed: Feb. 15, 1996

[51] Int. Cl.$^6$ .............................................. H01L 31/0312
[52] U.S. Cl. .............................................. 257/77; 257/741
[58] Field of Search ........................... 257/77, 741, 613

[56] References Cited

U.S. PATENT DOCUMENTS

| | | | |
|---|---|---|---|
| 3,984,261 | 10/1976 | Hawrylo | 148/33 |
| 4,985,742 | 1/1991 | Pankove | 257/77 |
| 4,990,994 | 2/1991 | Furukawa et al. | 257/77 |
| 5,273,933 | 12/1993 | Hatano et al. | 437/127 |
| 5,373,171 | 12/1994 | Imai et al. | 257/77 |

FOREIGN PATENT DOCUMENTS

| | | |
|---|---|---|
| 0 164 720 | 6/1985 | European Pat. Off. . |
| 0 249 777 | 5/1987 | European Pat. Off. . |
| 0 458 353 | of 1991 | European Pat. Off. . |
| 4267376 | 9/1992 | Japan .............................. 257/77 |

OTHER PUBLICATIONS

Dimitriev et al., Low Resistivity (~$10^5 \omega cm^2$) Ohmic Contacts to 6H Silicon Carbide Fabricated Using Cubic Silicon Carbide Contact Layer, Appl. Phys. Lett., vol. 64 (3), pp. 318–320 (Jan. 17, 1994).

*Primary Examiner*—Jerome Jackson
*Assistant Examiner*—Nathan Kelley
*Attorney, Agent, or Firm*—Pollock, Vande Sande & Priddy

[57] ABSTRACT

The present invention is a semiconductor device comprising a semiconductor layer of SiC, a metal layer adapted to form a low resistance ohmic contact with the SiC-layer and a thin layer of a material having a smaller bandgap than the SiC of the SiC-layer and is placed between the SiC-layer and the metal layer. The SiC-layer is highly doped at least in the region next to the thin layer, and the material of the thin layer is a Group 3B-nitride including indium and at least another Group 3B-element.

9 Claims, 1 Drawing Sheet

5,652,437

SEMICONDUCTOR DEVICE WITH A LOW RESISTANCE OHMIC CONTACT BETWEEN A METAL LAYER AND A SIC-LAYER

TECHNICAL FIELD OF THE INVENTION

The present invention relates to a semiconductor device comprising a semiconductor layer of SiC, a metal layer adapted to form a low resistance ohmic contact with the SiC-layer, and a thin layer of a material having a smaller band gap than the SiC of the SiC-layer and placed between the SiC-layer and the metal layer, with the SiC-layer being, at least in the region next to the thin layer, highly doped.

All types of semiconductor devices in which a contact between a metal layer and a SiC-layer is to be formed include, for example different types of diodes, transistors and thyristors. Due to the characteristics of SiC, such devices are often high power devices.

SiC is a semiconductor material having a large band gap, the magnitude of which is between 2.3 and 3.3 eV depending on the polytype in question, i.e. the gap between the valence band and the conduction band. For this reason, SiC has, in common with other wide band gap semiconductors, the problem that it is extremely difficult to form low resistance ohmic contacts on SiC. One reason for this difficulty is the large difference between the work function of the metal of such a metal layer and the electron affinity of the semiconductor, which results in a large Schottky-barrier height. Efforts to solve this problem have included the making of a heterojunction contact, whereby a material having a lower band gap is grown as an intermediate layer between the metal layer and the wide band gap semiconductor as defined above and as described in U.S. Pat. No. 3,984,261. Accordingly, the definition of "a metal layer adapted to form a low resistance ohmic contact with the SiC-layer" is to be interpreted broadly so as to expresses that there shall be formed a low-resistance ohmic contact between a metal layer and a SiC-layer, but that this may be done by interposing a thin layer of another material.

European patent B1 0 249 777 describes how such a heterojunction is used to obtain a low-resistance ohmic contact between a semiconductor material and a metal layer, but the semiconductor is not SiC, but a III-V-material, for instance GaP, which has a considerably lower band gap than SiC.

A known semiconductor device according to the introduction has been suggested (V. A. Dimitriev, K. Irvine, M. Spencer and G. Kelner Appl. Phys. Lett. vol. 64(3) p. 318 (1994)) for 6H SiC, which uses polytype 3C SiC as an intermediate layer, but the disadvantage of this is that the polytype 3C is still a relatively wide band gap material and the contact problem is thus not solved.

Another problem of different materials used so far as intermediate layers in such heterojunctions and also as semiconductors making a direct contact with a metal layer is that the Fermi-level of these materials is pinned as a result of a high density of traps within the band gap of the semiconductor. Typically pinning is due to deep states (traps) and therefore the Fermi-level resides close to the center of the band gap of the material. These states are, for example, formed by the deposition of the metal. The pinning is for a narrow region only, in this case the interface between the metal layer and the semiconductor, so that the Fermi-level is not "pinned" in the bulk of the semiconductor. Pinning is defined as the phenomena such that the Fermi-energy of the semiconductor is in this single location, i.e. at said interface, fixed at a single energy (the trap energy) independent of the doping condition in the semiconductor. This effect is typically seen between a metal and a semiconductor, for example the III-V compounds, such as GaAs, and results in a large barrier height. The effect is not observed at the heterojunction between semiconductors provided the interface is of good quality, i.e. of low trap density, and it would accordingly not be present between the SiC-layer and the thin layer in the device defined in the introduction. Normally, it is desired that the work function of the metal in question is matched with the electron affinity of the semiconductor to provide a low-resistance ohmic contact, but due to the pinning, the midgap states in the semiconductor will determine the height of the Schottky-barrier independent of the work function of the metal. This "pinning" phenomena exists also in semiconductor device according to European patent B1 0 249 777, but this phenomena is of minor importance, since the band gap of the semiconductors used there is very narrow.

SUMMARY OF THE INVENTION

The object of the present invention is to provide a semiconductor device according to the introduction, which has an excellent low-resistance ohmic contact between the SiC-layer and the metal layer. This object according to the invention is obtained by making the thin layer of a Group 3B-nitride.

Thus, it has been realized that Group 3B-nitrides do not have pinned (fixed) Fermi-levels at the interface with a metal, which means that the work function of the metal will determine the Schottky-barrier height, so that it will be possible to choose a suitable metal for a low barrier. Thus, it is possible to form a low-resistance ohmic contact between the SiC-layer and a metal layer by choosing a Group 3B-nitride having a smaller bandgap than the SiC of the SiC-layer as a thin layer between the metal layer and the SiC layer. Due to the fact that the SiC-layer is highly doped, at least in the region next to the thin layer, the thin layer may be undoped, since there will, due to "modulation doping", be a transfer of charge from the SiC layer, having a large band gap to the thin layer having a narrower band gap. As a result, the narrow band gap material has an excess of charge in the conduction band and will, in fact, behave as a metal, so that a low-resistance ohmic contact may be established without any doping in advance of the thin layer. This makes it easier to grow the thin layer with high quality. Furthermore, it is important that the heterojunction of the device has a high quality to avoid traps, i.e. mid-gap states there. This results from to the comparatively good lattice match of the Group 3B-nitrides with SiC.

According to a preferred embodiment of the invention the Group 3B-nitride comprises a content of indium and at least another Group 3B-element. Indium is a suitable element for making the band gap of the Group 3B-nitride narrower than that of SiC of any polytype, so that it is very advantageous to have such content in Group 3B-nitride. However, it is, for the ease of growth of a high quality thin layer, of importance that it also contain at least another Group 3B-element besides indium.

According to another preferred embodiment of the invention, the Group 3B-nitride has a content of at least indium and gallium. GaN has a larger band-gap than SiC, but it may be easily grown on SiC, and due to the addition of indium, the band gap is made narrower, so that the and change Group 3B-nitride is suited for the forming of a low resistance ohmic contact.

According to another preferred embodiment of the invention, the Group 3B-nitride is $Ga_{1-x}In_xN$. Such a material for the thin layer has been found to be easy to grow on SiC, have a smaller band gap than SiC, and having a non-pinned Fermi-level at the interface with a metal.

According to a highly preferred embodiment of the invention, the indium content of the Group 3B-nitride is adjusted to the metal chosen for matching the electron affinity of the material with the work function of the metal forming the metal layer. Thus, the indium content is a parameter easy to handle to adjust the electron affinity of the Group 3B-nitride to match the work function of the metal of the metal layer for reducing the barrier height of the ohmic contact between the metal layer and the thin layer.

According to a still further, also highly preferred embodiment of the invention, the indium content of the Group 3B-nitride is adjusted according to the type of doping, p or n, of the SiC-layer. In this way, the indium content will be a parameter to adjust the band-alignment according to whether one wants a p- or n-type contact. The other Group 3B-element of the Group 3B-nitride may have a gap between the conduction band and the valence band not being centered with respect to the band-gap of the SiC of the SiC-layer, so that different concentrations of indium in the Group 3B-nitride may be appropriate, depending on the type of doping of the SiC-layer close to the interface to the thin layer. For instance, it is believed that GaN has a band-gap center being displaced with respect to the band gap center of SiC, which means that different indium-contents may be needed for p- and n-doped SiC-layers.

According to another preferred embodiment of the invention, the thin layer is undoped. The advantages thereof have already been presented above, and the possibility to make this layer undoped is based on the fact that a modulation doping process takes place as a result of the high doping of the SiC next to the thin layer, the smaller band gap of the thin layer, and the fact that the layer really is thin.

Further advantages and preferred features of the invention will appear from the following description and the other dependent claims.

BRIEF DESCRIPTION OF THE DRAWINGS

With reference to the appended drawings, a specific description of a preferred embodiment of the invention is cited as an example.

In the drawings.

DETAILED DESCRIPTION OF A PREFERRED EMBODIMENT OF THE INVENTION

Figure 1A:
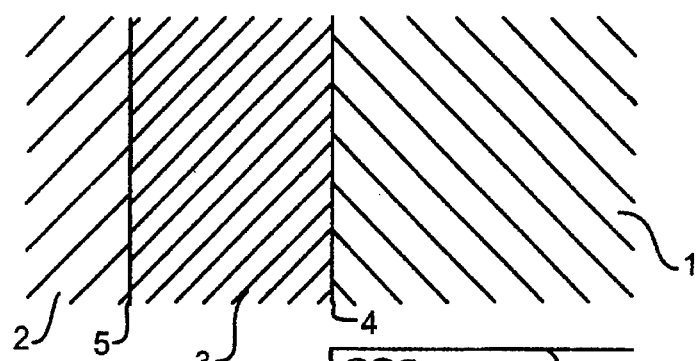
FIGS. 1a–c illustrate how the extension of the conduction band and the valence band would be in a semiconductor device of the invention from a SiC-layer, a thin Group 3B-nitride layer, and a metal layer at a contact of the device if the different layers would not have any influence on each other, and FIGS. 2a–b correspond to FIG. 1a–c but illustrates the real extension of the conduction and valence bands at the contact of the semiconductor device.
Figure 1B:
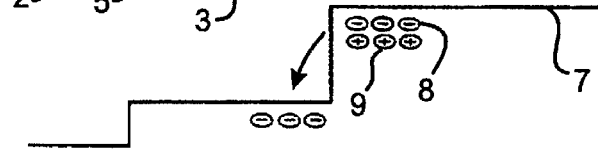
Figure 1C:

FIGS. 1a–c illustrate a low-resistance ohmic contact between a SiC-layer 1 and a metal layer 2 with an intermediate thin layer 3 of a Group 3B-nitride in a semiconductor device. The SiC-layer is a mono-crystalline layer of SiC of any polytype. The Group 3B-nitride is, in the present case, $Ga_{1-x}In_xN$, in which x is chosen to obtain a smaller bandgap of the Group 3B-nitride than the SiC of the SiC-layer 1 and for obtaining an electron affinity of the Group 3B-nitride matching the work function of the metal selected for said metal layer. The semiconductor device in question may be of any type, such as an IGBT, a GTO, and a rectifying diode.

In this way, two junctions are formed, a first heterojunction 4 between the SiC-layer 1 and said thin layer 3, and a second junction 5 between the thin layer and the metal layer. The SiC-layer 1 is highly doped with donors at least close to the heterojunction 4, but it is also possible to highly dope it with acceptors. Highly doped here means that the concentration of dopants exceeds $10^{17}$, preferably exceeding $10^{18}$ $cm^{-3}$. It is very schematically illustrated that the energy gap between the valence band 6 and the conduction band 7 is larger in the SiC layer 1 than in the thin layer 3. In this way a band-offset is obtained at the heterojunction 4.

Since the SiC-layer is highly doped with donors, these have their extra electrons 8 at a higher energy level than the conduction band level at the other side of the heterojunction, which results in a fall of the electrons as indicated by the arrow to the lower energy level in the thin layer 3 while ionising the donors and leaving a positive charge 9 in the SiC-layer 1. This technique of providing only the layer with the largest band gap with impurities is called selective doping or modulation doping. In this way an electrical field is created at the heterojunction bending the conduction bands in the way shown in FIGS. 2a–b. The higher the concentration of donors in the first layer comparatively close to the heterojunction, the sharper will the conduction band be bent. Due to the high concentration of dopants in the SiC-layer, a very narrow barrier 9 will in this way be established between the SiC-layer and the thin layer 3, so that electrons may easily tunnel through this barrier and the resistance of this heterojunction will be negligible.

The thin layer 3 may be undoped, since the conduction band will in this way, by the modulation doping process, be filled with electrons, so that this thin layer will act as a metal and have a very low resistance. It would, however, also be possible to dope the thin layer 3 with the dopant type corresponding to that of the SiC-layer, thus in the case shown in the figures with donors. The layer 3 has to be thin to obtain this metal behavior thereof, and "thin" will, in this embodiment, mean a thickness below 300 Å and, in some applications below 100 Å. The thin layer 3 is preferably monocrystalline, but it may also be poly-crystalline and still work depending on the influence of the grain boundary.

Figure 2A:
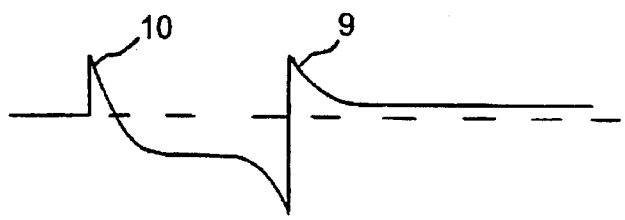
Figure 2B:

The Fermi-levels of the different layers have, as known, to be at the same level, which results in an extension of the conduction band and the valence band in accordance with FIGS. 2a–b. It has been found that the Fermi-level of a Group 3B-nitride is not pinned, i.e. fixed, at the interface to a metal, which means that there are relatively few mid gap states (traps) at the interface, which would change the position of the Fermi-level of the thin layer there, so that the barrier 10 then would be much higher. Accordingly, a low-resistance ohmic contact between a SiC-layer and a metal layer may be achieved by selecting a Group 3B-nitride as a material for a thin layer between the SiC-layer and the metal layer.

As already mentioned above, the mole fraction of In (indium) incorporated in the thin layer 3 can be varied to tune the band offset with respect to both the SiC-layer 1 and the metal layer 2. The higher the content of In in the Group 3B-nitride, the smaller will be the band gap thereof. GaN has a band gap which is slightly larger than most polytypes of SiC and a content of indium therein will reduce this band gap. The band gap of GaN is not centered with respect to the band gap of SiC, so that it will be suitable to choose different concentrations of indium in the Group 3B-nitride according to the type of doping, p or n, of the SiC-layer. Thus, the indium content may vary according to certain considerations, and will typically be between 5 and 20% of the N content.

A contact of this type may be easily produced by forming the highly doped SiC-layer 1, either by epitaxial growth (CVD, MBE etc.), or by ion implantation. The Group 3B-nitride layer 3 should be of high quality single crystal and should again be grown using an epitaxial technique (CVD, MBE, magnetron sputtering, etc.). Following the deposition of the Group 3B-nitride a metal layer 2 should be deposited by any of the available techniques, the metal being chosen to give a good contact to the Group 3B-nitride. Finally, the layers are patterned using lithography to cover only those areas where contact is required. The annealing temperature should be low, which means below 1000° C., but in most cases it may be considerably lower. The possibility of not doping the thin layer, but nevertheless obtaining a low-resistance ohmic contact, simplifies the production of this contact.

The invention is, of course, not in any way restricted to the preferred embodiments described above, but many possibilities to modifications thereof will be apparent to a man with ordinary skill in the art.

All definitions concerning the materials of the different device layers do, of course, include inevitable impurities as well as intentional doping of the layers in question.

The definition layer is to be interpreted broadly and comprises all types of volume extensions and shapes.

Other Group 3B-nitrides than GaInN are also conceivable, such as AlInN, in which case the In-content has to be comparatively high, since AlN has a much higher bandgap than SiC.

The SiC-layer may be of any polytype of SiC, such as for example 6H, 4H, 3C and 15R.

I claim:

1. A semiconductor device comprising a semiconductor layer of SiC, a metal layer adapted to form a low resistance ohmic contact with the SiC-layer and a thin layer of a material having a smaller bandgap than the SiC of the SiC-layer and is placed between the SiC-layer and the metal layer, said SiC-layer being highly doped at least in the region next to said thin layer, wherein the material of said thin layer is a Group 3B-nitride including indium and at least another Group 3B-element.

2. A device according to claim 1, wherein said Group 3B-nitride includes at least indium and gallium.

3. A device according to claim 1, wherein said Group 3B-nitride is $Ga_{1-x}In_xN$.

4. A device according to claim 1, wherein the indium content of the Group 3B-nitride is adjusted to the metal chosen for matching the work function of said material with the work function of the metal of said metal layer.

5. A device according to claim 1, wherein the indium content of said Group 3B-nitride is selected according to the type of doping (p or n), of said SiC-layer.

6. A device according to claim 1, wherein said thin layer is undoped.

7. A device according to claim 1, wherein said thin layer has a thickness below 300 Å.

8. A device according to claim 1, wherein said thin layer is a mono-crystalline layer.

9. A device according to claim 1, wherein highly doped means a concentration of dopants exceeding $10^{18}$ cm$^{-3}$.

* * * * *